(12) United States Patent
Kobayashi

(10) Patent No.: US 9,299,525 B2
(45) Date of Patent: Mar. 29, 2016

(54) THERMIONIC CATHODE WITH EVEN ELECTRIC FIELD DISTRIBUTION ON ELECTRON EMITTING SURFACE

(71) Applicant: NUFLARE TECHNOLOGY, INC., Shizuoka (JP)

(72) Inventor: Ryoei Kobayashi, Shizuoka (JP)

(73) Assignee: NUFLARE TECHNOLOGY, INC., Kanagawa (JP)

(*) Notice: Subject to any disclaimer, the term of this patent is extended or adjusted under 35 U.S.C. 154(b) by 0 days.

(21) Appl. No.: 14/047,827

(22) Filed: Oct. 7, 2013

(65) Prior Publication Data

US 2014/0139100 A1    May 22, 2014

(30) Foreign Application Priority Data

Nov. 19, 2012  (JP) ................. 2012-253120

(51) Int. Cl.
*H01J 1/148* (2006.01)
*H01J 9/04* (2006.01)
*H01J 37/065* (2006.01)

(52) U.S. Cl.
CPC . *H01J 1/148* (2013.01); *H01J 9/04* (2013.01); *H01J 37/065* (2013.01); *H01J 2237/06308* (2013.01); *H01J 2237/26* (2013.01); *H01J 2237/31754* (2013.01)

(58) Field of Classification Search
USPC ........................................ 313/346 R
See application file for complete search history.

(56) References Cited

U.S. PATENT DOCUMENTS

| 4,528,474 | A  | * | 7/1985  | Kim ......................... 313/346 R |
| 7,176,610 | B2 |   | 2/2007  | Katsap |
| 2004/0150322 | A1 | * | 8/2004 | Busta ........................... 313/495 |
| 2010/0301736 | A1 | * | 12/2010 | Morishita et al. ............. 313/341 |
| 2014/0097736 | A1 |   | 4/2014 | Katsap |

* cited by examiner

*Primary Examiner* — Ashok Patel
(74) *Attorney, Agent, or Firm* — Patterson & Sheridan, LLP.

(57) ABSTRACT

A thermionic cathode of an embodiment includes a carbon coating applied to an outer surface of the side, the carbon coating comprising a contiguous extended portion surrounding the upper section and spaced apart from said upper section by a gap having 1 μm or more and 10 μm or less in width and having a difference of 1 μm or less in the width between a maximum value and a minimum value in a periphery of the electron emitting surface.

3 Claims, 9 Drawing Sheets

THERMIONIC CATHODE WITH EVEN ELECTRIC FIELD DISTRIBUTION ON ELECTRON EMITTING SURFACE

CROSS REFERENCE TO RELATED APPLICATION

This application is based upon and claims the benefit of priority from the prior Japanese Patent Application No. 2012-253120, filed on Nov. 19, 2012; the entire contents of which are incorporated herein by reference.

FIELD

Embodiments described herein relate generally to a cathode used in a mask writer and a method for manufacturing the cathode.

BACKGROUND

A lanthanum hexaboride ($LaB_6$), a cerium hexaboride ($CeB_6$), a hafnium carbide (HfC), or the like which is crystallized or sintered is used as an electron source or emitter (hereinafter described as a cathode or a thermionic cathode) for various apparatuses (for example, scanning electron microscopes (SEM) and transmission electron microscopes (TEM)). The cathode generally has a tapered shape or truncated conical shape, and a tip thereof is cut off by a predetermined size. Further, the tip of the cathode generally has a flat or spherical shape.

However, the cathode formed of the above-described material evaporates at 1650 K to 1900 K (Kelvin) which are operating temperatures, and the size of the cathode tip shrinks. As a result, there arises a problem that the usable time (lifetime) of the cathode is limited. Further, electrons are emitted not only from the tip of the cathode but also from a tapered part. Electrons emitted from this tapered part are as many as 65% of the electrons emitted from the entire cathode. Thus, it is difficult to obtain a converged electron beam.

Accordingly, a cathode whose tapered part is covered with carbon (C) has been proposed. The evaporation rate of this carbon is very low, and its steam pressure is about $10^{-10}$ Torr at 1650 K to 1900 K as operating temperatures, which is about less than or equal to a thousandth of that of the lanthanum hexaboride ($LaB_6$), the cerium hexaboride ($CeB_6$), and the like. It is thus possible to extend the usable time of the cathode for about 3000 hours. Further, a converged electron beam can be easily obtained because electrons are not emitted from the tapered part covered with carbon.

However, the usable time is still limited in such a cathode. This is because evaporation or disappearance occurs partially in the cathode by chemical interaction between the cathode material (for example, the lanthanum hexaboride ($LaB_6$), the cerium hexaboride ($CeB_6$), or the like) and carbon. This can be seen in the edges of the emitting surface of the cathode which are in contact with the carbon coating.

In order to solve the above-described problem, there has been proposed a cathode in which a gap is provided between the cathode and the carbon covering the tapered part at the tip of the cathode. The cathode of this proposal has a structure in which a carbon layer is disposed around the cathode being a center, and the gap is provided between the cathode and the carbon layer. That is, in the cathode tip, the material (for example, the lanthanum hexaboride ($LaB_6$), the cerium hexaboride ($CeB_6$), or the like) of the cathode and the carbon are not in direct contact, and thus the partial evaporation or disappearance by chemical interaction can be suppressed.

However, when the width of the gap formed in the tip of the cathode differs depending on its position, an electric field distribution in the cathode tip becomes uneven, and there occurs a phenomenon such that the peak (position where a current value is highest) of an emitter current (electron beam) is displaced from the center of the cathode. As a result, an irradiation position of electron beam is affected. For example, in a mask writer, writing precision with electron beam is affected.

DETAILED DESCRIPTION

Hereinafter, embodiments will be described with reference to the drawings.

Embodiments

Figure 1:
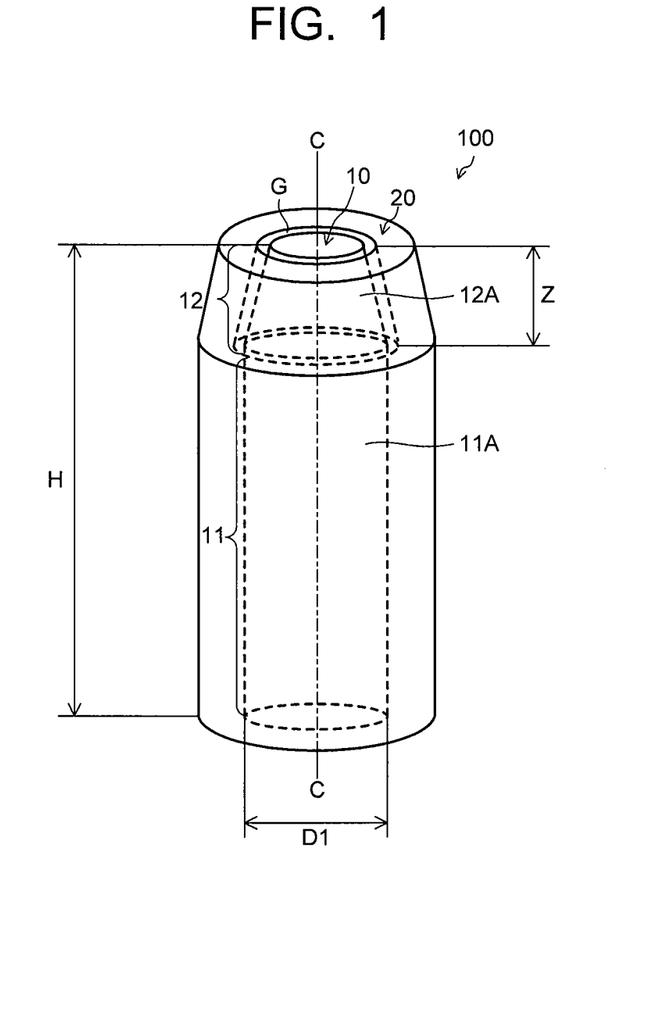
FIG. 1 is an overhead view of a cathode according to an embodiment.
Figure 2:
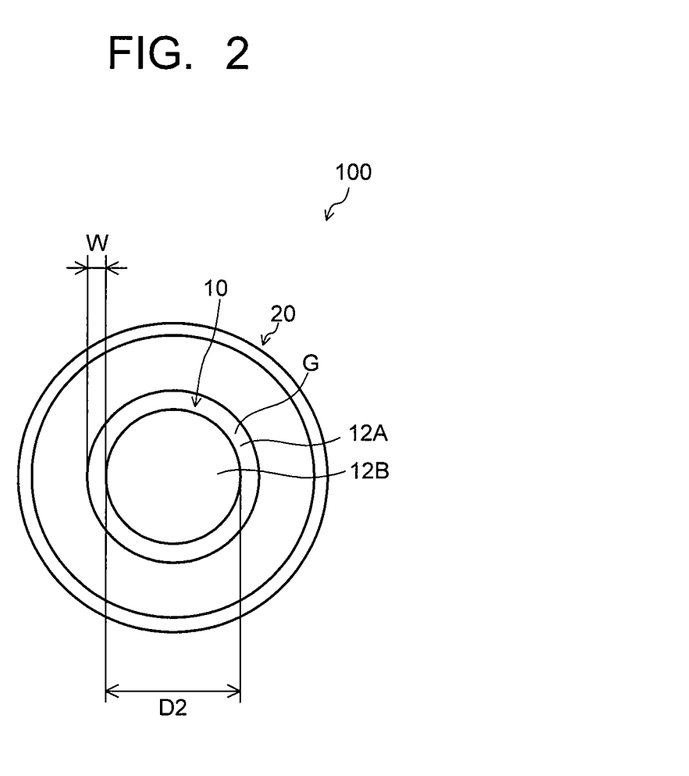
FIG. 2 is a plan view of the cathode according to the embodiment.
Figure 3:
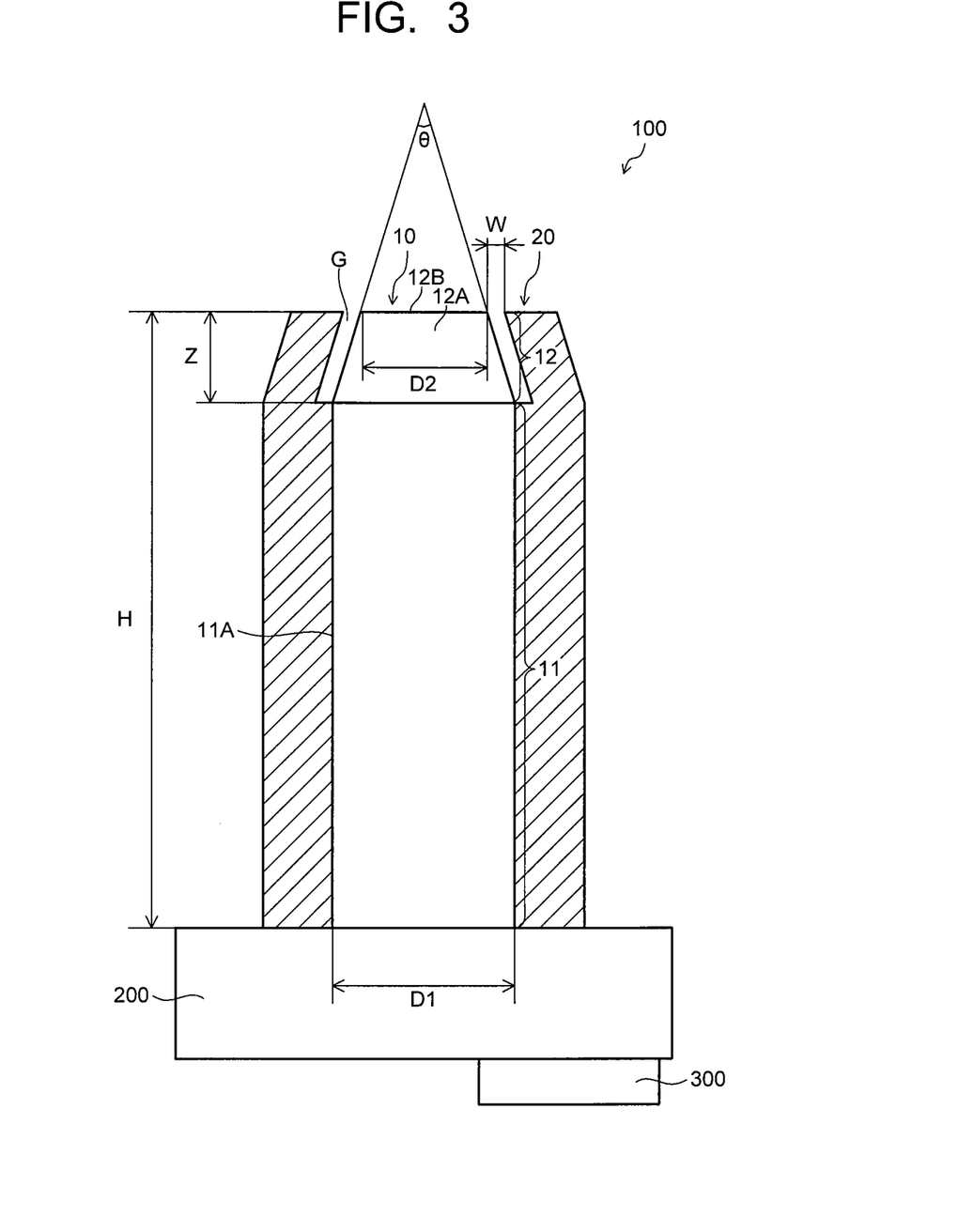
FIG. 3 is a partial cross-sectional view of the cathode according to the embodiment.

FIG. 1 is an overhead view of a cathode 100 according to an embodiment, FIG. 2 is a plan view of the cathode 100, and FIG. 3 is a partial cross-sectional view of the cathode 100 (FIG. 3 illustrates a side of the main body 10 and a cross-section of a covering layer 20). As illustrated in FIG. 1 to FIG. 3, the cathode 100 has a main body 10 and a covering layer 20 covering the main body 10. Note that FIG. 3 is a view of a state that the cathode 100 is mounted on a support substrate 200 having a heater 300.

The main body 10 is formed of a material selected from the group consisting of a crystal of lanthanum hexaboride ($LaB_6$), a crystal of cerium hexaboride ($CeB_6$), a crystal of hafnium carbide (HfC), a sintered compact of lanthanum hexaboride ($LaB_6$), a sintered compact of cerium hexaboride ($CeB_6$), a sintered compact of hafnium carbide (HfC), a sintered compact of tungsten-barium-aluminum-oxygen (W—Ba—Al—O), and a sintered compact of barium-scandium-tungsten-aluminum (Ba—Sc—W—O). The main body 10 may contain inevitable impurities.

The main body 10 has a lower part 11 having a cylindrical shape and an upper part 12 having a truncated conical shape whose tip is flat. Note that the lower part 11 and the upper part 12 are formed integrally. A height H of the main body 10 is about 0.5 mm to 3 mm, and a diameter D1 of the lower part 11 is about 200 μm to 800 μm. The upper part 12 has a conical surface 12A and an electron emitting surface 12B provided at an upper end. In the cathode 100 in this embodiment, the shape of the electron emitting surface 12B is flat, but it may be spherical. A diameter D2 of the electron emitting surface 12B is about 5 μm to 200 μm. Further, a cone angle θ of the upper part 12 of the main body 10 is preferably about 20° to 90°, more preferably about 60° to 90° (see FIG. 3).

The covering layer 20 covers an outer surface of sides of the main body 10 for the purpose of suppressing evaporation of the main body 10 to extend the usable time (lifetime) of the cathode 100. The covering layer 20 is formed of a material (a carbon material) selected from the group consisting of graphite, colloidal graphite, diamond-like carbon, and pyrolytic graphite. The covering layer 20 may contain inevitable impurities.

Specifically, the covering layer 20 covers an outer peripheral surface 11A of the lower part 11 of the main body 10 and the conical surface 12A of the upper part 12. On the lower part 11, the covering layer 20 covers the outer peripheral surface 11A in a state indirect contact with the outer peripheral surface 11A, but on the upper part 12 of the main body 10, the covering layer 20 covers the conical surface 12A in a state not in direct contact with the conical surface 12A but having a gap G from the conical surface 12A.

As illustrated in FIG. 2, the gap G is formed along the entire periphery of the conical surface 12A. That is, in the covering layer 20 of the cathode 100, the gap G is formed along the entire periphery of the electron emitting surface 12B. A depth Z of the gap G is about 10 μm to 200 μm. Note that the depth Z is a distance from the electron emitting surface 12B to a bottom surface of the gap G which is measured along a center axis C-C of the main body 10.

Further, the width W of the gap G is preferably 1 μm or more and 10 μm or less. When the width W of the gap G is less than 1 μm, the distance between the main body 10 and the covering layer 20 is too close, and there is a concern that evaporation or disappearance occurs by chemical interaction between the main body 10 and the covering layer 20. On the other hand, when the width W of the gap G is more than 10 μm, an electric field distribution on the electron emitting surface 12B becomes uneven, and there is a concern that the peak (position where a current value is highest) of an emitter current (electron beam) is displaced from the center of the electron emitting surface 12B.

Preferably, a difference between the maximum value $W_{max}$ and the minimum value $W_{min}$ of the width W of the gap G in the periphery of the electron emitting surface 12B is 1 μm or less. When the width W of the gap G in the periphery of the electron emitting surface 12B is uneven, the electric field distribution on the electron emitting surface 12B becomes uneven, and there is a concern that the peak (position where a current value is highest) of an emitter current (electron beam) is displaced from the center of the electron emitting surface 12B. For example, when the cathode 100 of this embodiment is used in a mask writer, there is a concern that writing precision is affected adversely.

FIG. 4A to FIG. 4D are explanatory views of steps of manufacturing the cathode 100 according to this embodiment (unlike FIG. 3, FIG. 4A to FIG. 4D illustrate the main body 10 in a cross-section). Hereinafter, with reference to FIG. 4A to FIG. 4D, a method for manufacturing the cathode 100 according to this embodiment will be described. Note that the same components as those described with reference to FIG. 1 to FIG. 3 are denoted by the same reference signs, and duplicated descriptions are omitted.

Figure 4A:
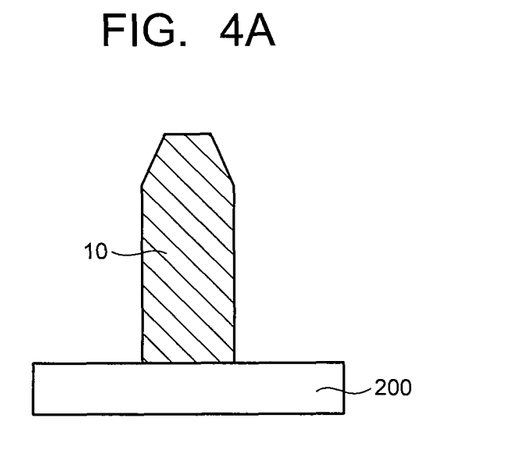
FIG. 4A to FIG. 4D are views of manufacturing steps of the cathode according to the embodiment.
Figure 4B:
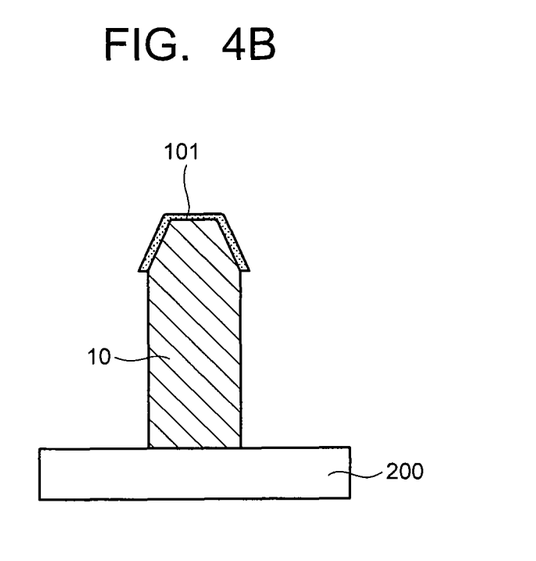

First, the main body 10 described with reference to FIG. 1 to FIG. 3 is prepared (see FIG. 4A). Next, a sacrificial film 101 is formed on a surface of the main body 10 (see FIG. 4B). In this case, the sacrificial film 101 is formed on a surface excluding the outer peripheral surface 11A of the lower part 11 of the main body 10, that is, a surface of the upper part 12 of the main body 10. In general, the sacrificial film 101 is formed of one or more materials. Preferably, the sacrificial film 101 can be removed from the main body 10 without affecting the main body 10.

For the sacrificial film 101, various organic films, acrylic resin, nitrocellulose, and the like can be used. Further, as an organic film, polyvinylpyrrolidone styrene (PVP styrene), 4-methacryloxyethyl trimellitic anhydride (4-META), meta-methyl-metacrylate (MMA), or the like can be used. Note that the materials which can be used for the sacrificial film 101 are examples, and other materials may be used.

Figure 4C:
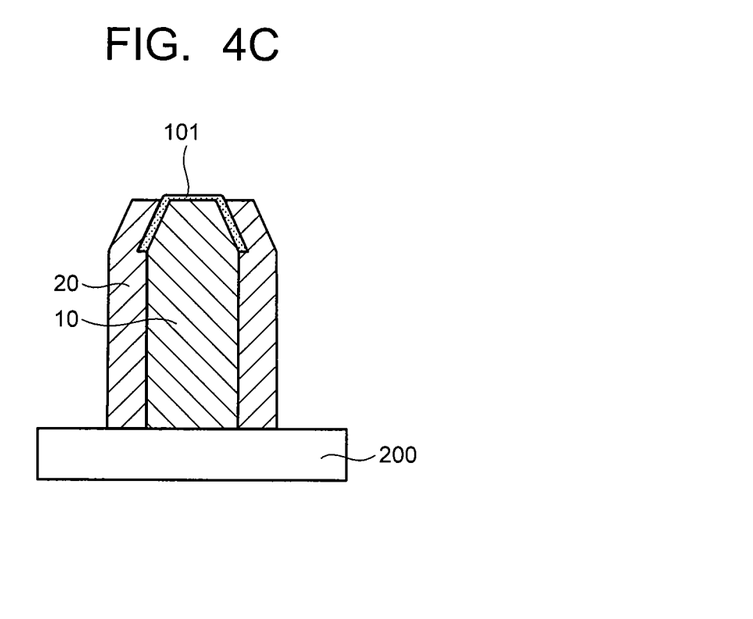

Next, the covering layer 20 is formed on the main body 10 and the sacrificial film 101 (see FIG. 4C). The covering layer 20 can be formed by vapor deposition or the like. At this time, note that the covering layer 20 is formed only on the outer peripheral surface of the lower part 11 of the main body 10 and the conical surface 12A of the upper part 12, and is not formed on the electron emitting surface 12B.

Figure 4D:
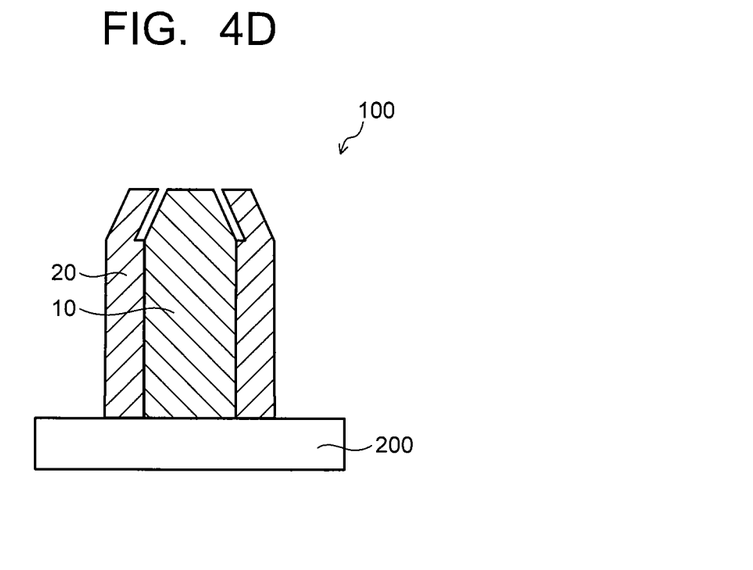

Next, the sacrificial film 101 is removed (see FIG. 4D). At this time, note that the main body 10 and the covering layer 20 are not damaged. Although depending on the material of the sacrificial film 101, various methods can be used for removing the sacrificial film 101. For example, when the material of the sacrificial film 101 is an organic film, the sacrificial film 101 can be removed by heating. The temperatures in this case are, preferably, in the range of about 400° C. to 600° C. It is possible to remain a portion of the covering layer 20 so as to surround the upper section 12 and spaced apart from the upper section 12 by removing the sacrificial film 101.

Figure 5A:
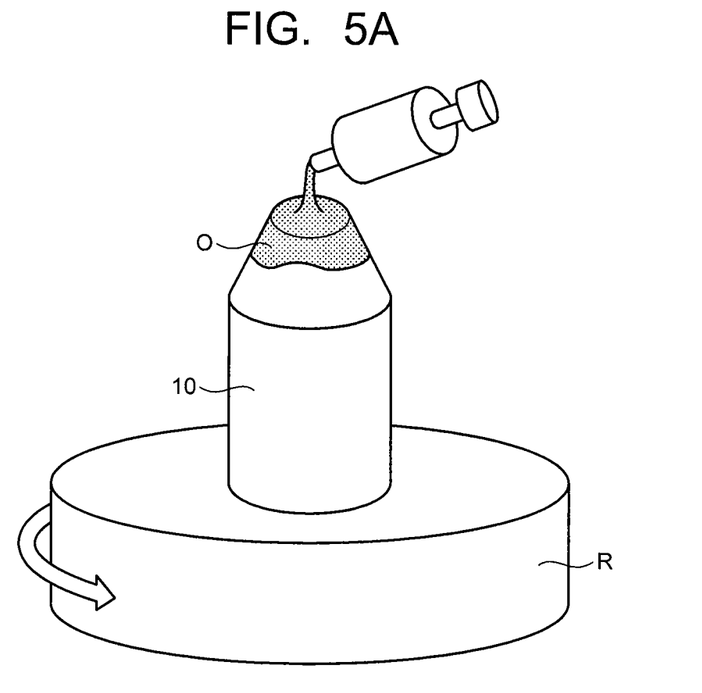
FIG. 5A and FIG. 5B are explanatory views of a method of forming a sacrificial film according to the embodiment.
Figure 5B:
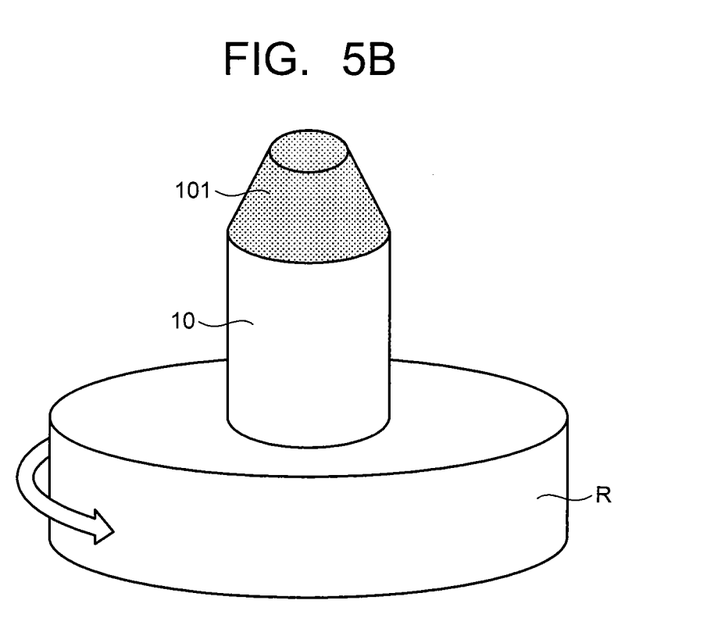
Figure 6A:
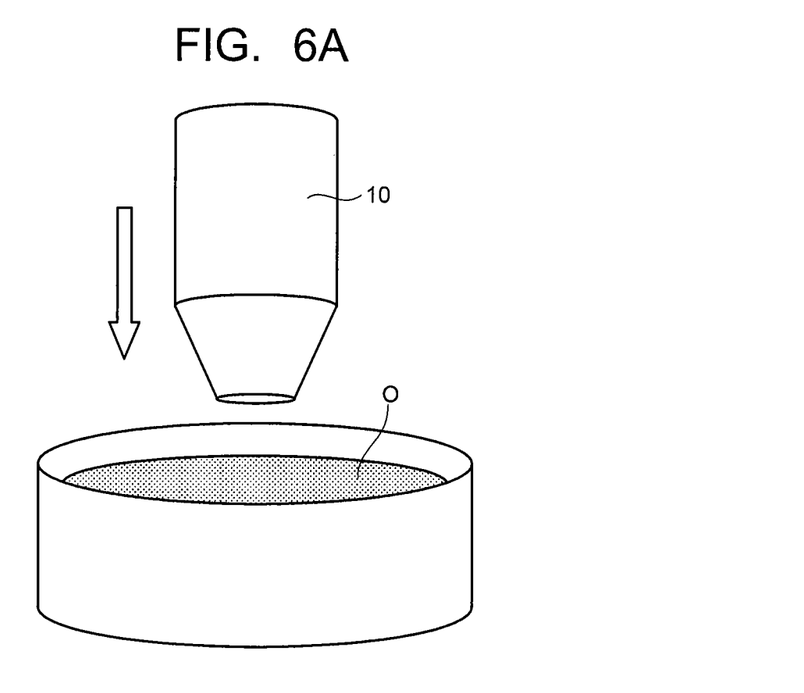
FIG. 6A and FIG. 6B are explanatory views of the method of forming the sacrificial film according to the embodiment.
Figure 6B:
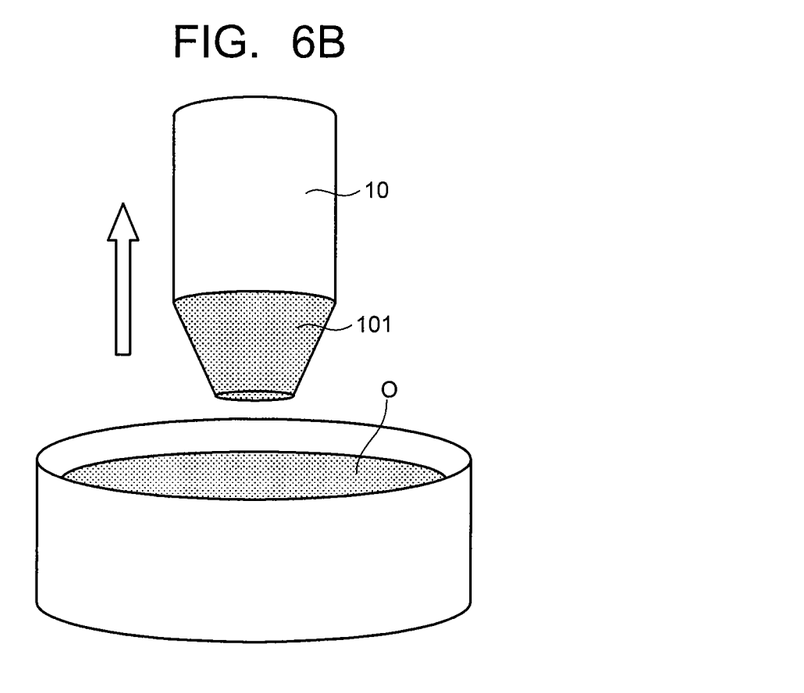

FIG. 5A to FIG. 7 are explanatory views of a method of forming the sacrificial film 101. The sacrificial film 101 can be formed by one of various methods. For example, as illustrated in FIG. 5A and FIG. 5B, the main body 10 may be mounted on a turntable R, and while rotating the turntable R, a solution of organic matter O which is a precursor for the sacrificial film 101 may be applied on the upper part 12 of the main body 10, so as to form the sacrificial film 101 (spin coating method). Namely, the sacrificial film 101 is formed by: mounting the main body 10 on the turntable R with the upper section 12 facing upward; rotating the turntable R around the perpendicular line to the turntable R with respect to the upper section 12; and dropping the solution of organic matter O on the upper section 12, by means of centrifugal force. As illustrated in FIG. 6A and FIG. 6B, the upper part 12 of the main body 10 may also be immersed directly in the solution of organic matter O as a precursor for the sacrificial film 101, so as to form the sacrificial film 101 on the upper part 12 of the main body 10. For example, it is possible to form the sacrificial film 101 by preparing the solution of organic matter O in a container and dipping the upper section 12 of the main body 10 in the solution.

Figure 7:
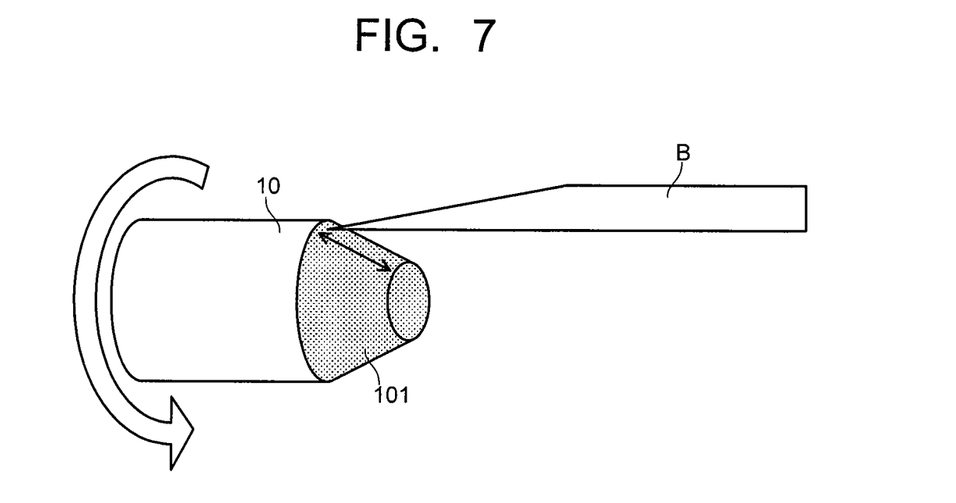
FIG. 7 is an explanatory view of the method of forming the sacrificial film according to the embodiment.

Note that, preferably, the viscosity of the solution of organic matter O as the precursor for the sacrificial film 101 is low, so as to make the thickness of the sacrificial film 101 even. Further, as illustrated in FIG. 7, after the precursor is applied and dried, the surface of the precursor may also be grinded physically by a blade B or the like so that the thickness becomes even. At that time, preferably, a grinding apparatus capable of adjusting a position in units of μm (μm order) is used.

As described above, when the main body 10 is covered with the covering layer 20, on the upper part 12 of the main body 10, the cathode 100 according to this embodiment covers the conical surface 12A in a state of having the gap G from the conical surface 12A. That is, in the cathode 100 of this embodiment, the conical surface 12A of the main body 10 and the covering layer 20 are not in direct contact. Accordingly, it is possible to suppress evaporation or disappearance of the main body 10 and the covering layer 20 by chemical interaction. Therefore, the usable time (lifetime) of the cathode 100 can be extended.

Further, in the cathode 100 of this embodiment, the gap G is formed along the entire periphery of the conical surface 12A. The width W of the gap G is then 1 μm or more. Thus, it is possible to suppress evaporation or disappearance of the main body 10 and the covering layer 20 by chemical interaction due to that the distance between the main body 10 and the covering layer 20 is too close. Further, the width W of the gap G is 10 μm or less. This can suppress that the electric field distribution becomes uneven on the electron emitting surface 12B and causes decrease in writing precision.

Moreover, in the cathode 100 of this embodiment, the difference between the maximum value $W_{max}$ and the minimum value $W_{min}$ of the width W in the periphery of the electron emitting surface 12B is 1 μm or less. This can effectively suppress that the electric field distribution becomes uneven on the electron emitting surface 12B, and that the peak (position where a current value is highest) of an emitter current (electron beam) is displaced from the center of the electron emitting surface 12B. Thus, when the cathode 100 of this embodiment is used in a mask writer for example, it is possible to suppress decrease in writing precision (for example, a writing position, a blur in a writing pattern, and the like).

Other Embodiments

While several embodiments of the present invention have been described, it should be noted that the above-described embodiments are illustrative and not intended to limit the invention to these embodiments. The embodiments can be implemented in a variety of other forms, and various omissions, substitutions, and changes can be made within the range not departing from the spirit of the invention. For example, the cathode 100 according to the embodiments can be used in various apparatuses such as scanning electron microscopes (SEM), transmission electron microscopes (TEM), and the like.

Example

Figure 8:
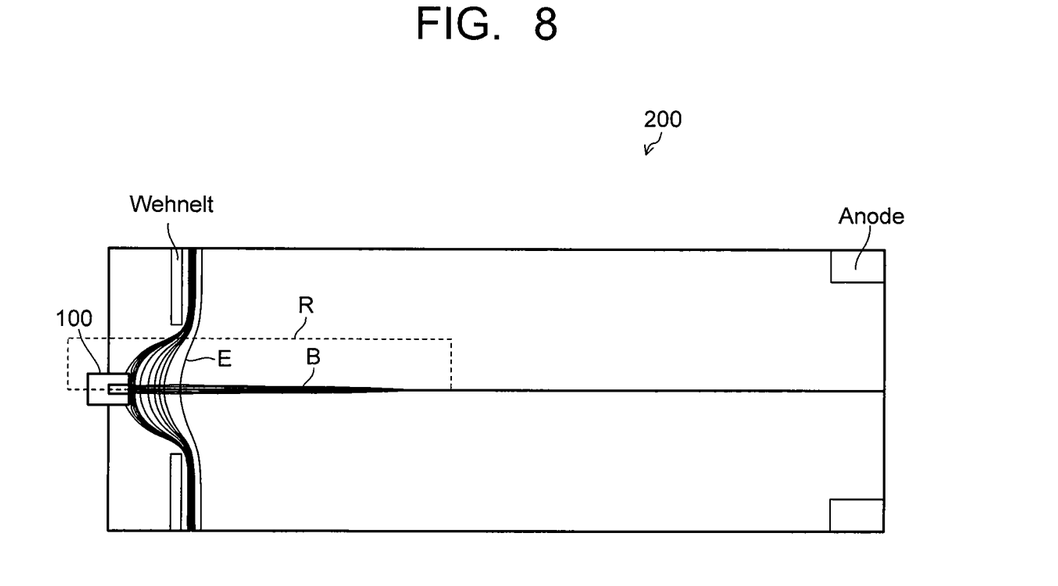
FIG. 8 is a structural diagram of an electron gun using a cathode according to an example.

In this example, a simulation was performed with respect to an electric field distribution and a spread of electron beam in the case where the width W of the gap G of the cathode 100 described with reference to FIG. 1 to FIG. 3 is varied and the same beam current is emitted from the cathode 100. FIG. 8 is a schematic diagram of an electron gun 200 used for the simulation. As illustrated in FIG. 8, in the simulation the cathode 100 was used, and the distribution of an electron beam emitted from this cathode 100 and an electric field distribution in the vicinity of the cathode 100 were examined.

Figure 9A:
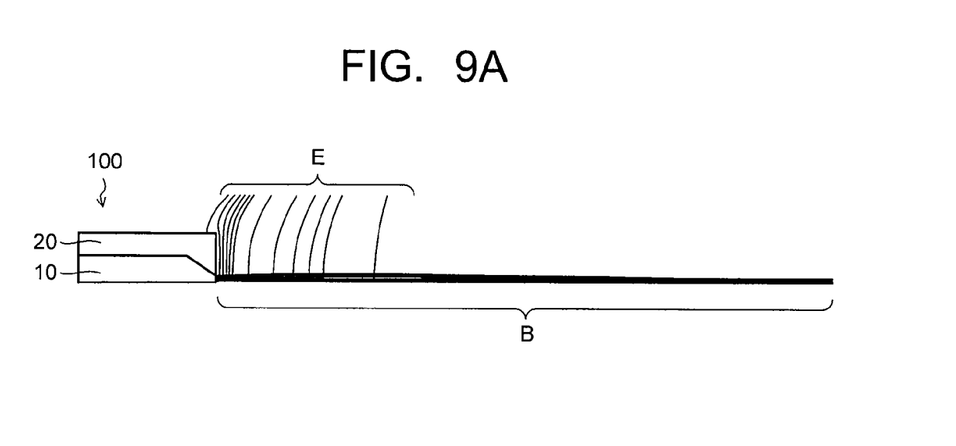
FIG. 9A to FIG. 9C are diagrams illustrating simulation results of the cathode according to the example.
Figure 9B:
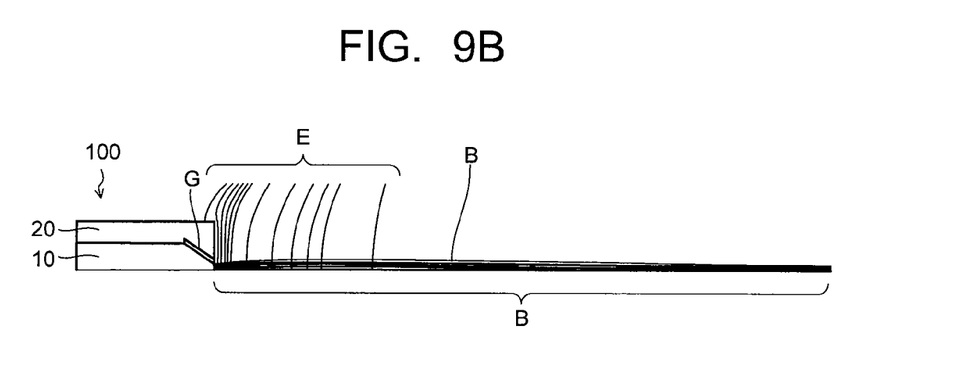
Figure 9C:
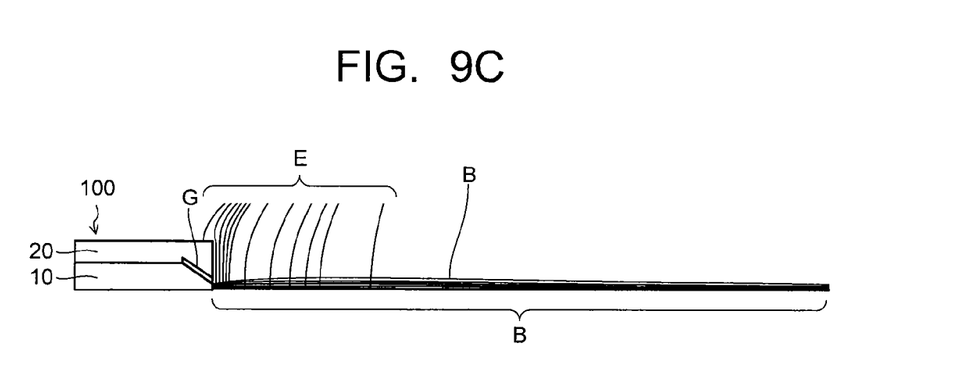

FIG. 9A to FIG. 9C illustrate simulation results of an electric field distribution and an electron beam in the vicinity of the cathode 100 when the electron beam is irradiated in an area R of FIG. 8. FIG. 9A illustrates a simulation result of the case where the width W of the gap G is 0 μm (there is no gap). FIG. 9B illustrates a simulation result of the case where the width W of the gap G is 2 μm. FIG. 9C illustrates a simulation result of the case where the width W of the gap G is 5 μm.

Note that reference sign B in FIG. 8 and FIG. 9A to FIG. 9C represents a spread of electron beam (electric charge distribution). Further, reference sign E in FIG. 8 and FIG. 9A to FIG. 9C represents a spread of electric field (electric field distribution).

From simulation results illustrated in FIG. 9A to FIG. 9C, it can be seen that the electron beam B spreads as the width W of the gap G increases. That is, it can be seen that the narrower the width W of the gap G, the smaller the spread of electron beam. However, when the width W of the gap G is narrow, the main body 10 and the covering layer 20 react with each other, and hence it is not preferable. Thus, preferably, the width W of the gap G is in the range of 1 μm or more and 10 μm or less.

What is claimed is:

1. A thermionic cathode, comprising:
   a main body having an upper section and sides, the upper section having an electron emitting surface; and
   a carbon coating applied to an outer surface of the sides, the carbon coating comprising a contiguous extended portion surrounding the upper section and spaced apart from said upper section by a gap formed by using a sacrificial film,
   the gap being made to be 1 μm or more and 10 μm or less in width and to have a difference of 1 μm or less in width between a maximum value and a minimum value in a periphery of the electron emitting surface.

2. The thermionic cathode according to claim 1,
   wherein the main body is formed of a material selected from the group consisting of crystals of lanthanum hexaboride ($LaB_6$), cerium hexaboride ($CeB_6$), and hafnium carbide (HfC), and sintered compacts of lanthanum hexaboride ($LaB_6$), cerium hexaboride ($CeB_6$), hafnium carbide (HfC), tungsten-barium-aluminum-oxygen (W—Ba—Al—O), and barium-scandium-tungsten-aluminum (Ba—Sc—W—O).

3. The cathode according to claim 1,
   wherein the upper section of the main body has a truncated conical shape.

\* \* \* \* \*